United States Patent
Sanduleanu

(10) Patent No.: US 7,463,069 B2
(45) Date of Patent: Dec. 9, 2008

(54) PHASE DETECTOR WITH SELECTION OF DIFFERENCES BETWEEN INPUT SIGNALS

(76) Inventor: Mihai Adrian Tiberiu Sanduleanu, Prof. Holstlaan 6, 5656 AA Eindhoven (NL)

( * ) Notice: Subject to any disclaimer, the term of this patent is extended or adjusted under 35 U.S.C. 154(b) by 147 days.

(21) Appl. No.: 10/523,344

(22) PCT Filed: Jul. 23, 2003

(86) PCT No.: PCT/IB03/03435
§ 371 (c)(1),
(2), (4) Date: Feb. 1, 2005

(87) PCT Pub. No.: WO2004/013956
PCT Pub. Date: Feb. 12, 2004

(65) Prior Publication Data
US 2006/0076981 A1    Apr. 13, 2006

(30) Foreign Application Priority Data
Aug. 1, 2002    (EP) .................................. 02078157

(51) Int. Cl.
*H03D 13/00* (2006.01)
(52) U.S. Cl. .................. 327/7; 327/12; 327/77
(58) Field of Classification Search ............. 327/3, 327/7–12, 77–80
See application file for complete search history.

(56) References Cited

U.S. PATENT DOCUMENTS 4,868,513 A * 9/1989 Piercy et al. ................ 327/156
6,118,730 A * 9/2000 Kubo et al. .................. 365/233
6,310,521 B1 * 10/2001 Dalmia ........................ 331/11
6,566,967 B1 * 5/2003 Anumula et al. ............ 331/11
6,700,414 B2 * 3/2004 Tsujino ........................ 327/3

FOREIGN PATENT DOCUMENTS

GB    2 027 295    2/1980

* cited by examiner

*Primary Examiner*—Lincoln Donovan
*Assistant Examiner*—William Hernandez
(74) *Attorney, Agent, or Firm*—Peter Zawilski

(57) ABSTRACT

Known phase detectors have feedbackloops and do not function properly under severe conditions. By providing said phase detectors with difference establishers (1) for establishing differences between input signals and with selectors (2) for selecting one of said differences to be used as an output signal for phase locking purposes, the phase detectors operate better under more severe conditions, with any dead-zone having disappeared. Said selector (2) is a feedbackless selector, then a loop delay no longer exists, the linear range will not get any smaller for higher frequencies, the output jitter will not increase, for sampled input signals. Said selector (2) comprises latches (21,22) and a multiplexer (23). A converter (3) converts input signals into compensated input signals, via a buffer circuit (31,33) coupled to a replica circuit (32,34) per input signal, to provide input signals having substantially equal amplitudes and being compensated with process errors and temperature variations. The difference establisher (1) is based upon moduli or squares.

9 Claims, 2 Drawing Sheets

PHASE DETECTOR WITH SELECTION OF DIFFERENCES BETWEEN INPUT SIGNALS

Figure 1:
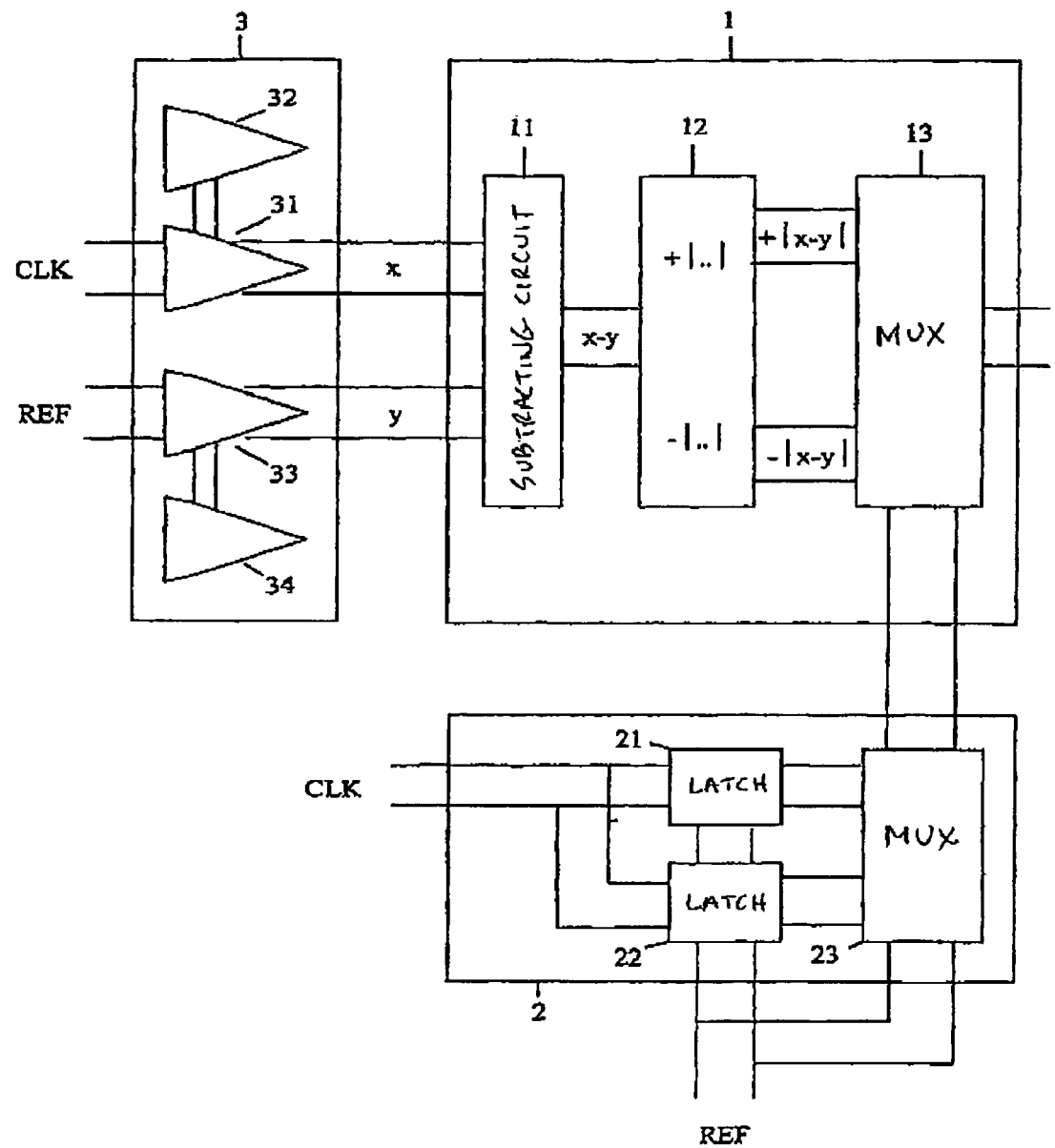

The invention relates to a phase detector for detecting a phase between a first input signal and a second input signal.

The invention also relates to a Phase Locked Loop comprising a phase detector for detecting a phase between a first input signal and a second input signal, and to a method for detecting a phase between a first input signal and a second input signal, and to a processor program product for detecting a phase between a first input signal and a second input signal.

Such a phase detector forms for example part of a Phase Locked Loop or PLL as for example used in PLL based phase demodulators where a modulated phase is converted into a voltage and in zero-IF (intermediate frequency) receivers requiring a phase detector with possible frequency detection capabilities.

A prior art phase detector is known from U.S. Pat. No. 6,366,145 B1, which discloses in its FIG. 4 a digital phase detector (102) comprising a phase detector (122), a filter (124) and a phase-switcher (126).

Such a known phase detector is for example constructed with two D-FlipFlops and a NAND gate: Both D-inputs of both D-FlipFlops receive logic one, the clock-input of the first D-FlipFlop receives the REFerence signal, the clock-input of the second D-FlipFlop receives the CLocK signal, the Q-output of the first D-FlipFlop generates the UP-signal, the Q-output of the second D-FlipFlop generates the DOWN-signal, which UP-signal and DOWN-signal are further supplied to inputs of said NAND gate, of which the output is coupled to both Reset-inputs of both D-FlipFlops for resetting purposes.

Known phase detectors are disadvantageous, inter alia, due to not functioning properly under more severe conditions: for example the linear range (the range in which the phase detector operates linearly) gets smaller for higher frequencies; and for example the output jitter increases a lot for sampled input signals; and for example the disadvantages of the dead-zone of known phase detectors will increase under these more severe conditions.

It is an object of the invention, inter alia, of providing a phase detector as defined in the preamble which functions properly under more severe conditions.

The phase detector according to the invention is characterized in that said phase detector comprises a difference establisher for establishing differences between said input signals and comprises a selector for selecting one of said differences to be an output signal.

Said difference establisher will establish differences between said input signals by for example calculating a first difference signal and a second difference signal, after which said selector will select one of said difference signals to be used as an output signal for phase locking purposes.

The invention is based upon an insight, inter alia, that differences between said input signals will give an indication of the phase (difference) to be detected, and is based upon a basic idea, inter alia, that several differences can be established, after which the best one is to be selected.

The invention solves the problem, inter alia, of providing a phase detector which operates properly under more severe conditions, and is advantageous, inter alia, in that any dead-zone of this phase detector has disappeared, as a result of establishing differences and selecting one of them.

A first embodiment of the phase detector according to the invention as defined in claim 2 is advantageous in that said selector is a feedbackless selector.

Said feedbackless selector does not have any loop (at block level), as a result of which at higher frequencies, due to a loop delay in said selector no longer existing (at block level), the linear range (the range in which the phase detector operates linearly) will not get any smaller. And due to any loop no longer being present in said selector (at block level), for sampled input signals, the output jitter will not increase.

A second embodiment of the phase detector according to the invention as defined in claim 3 is advantageous in that said selector comprises latches clocked by said second input signal and for receiving said first input signal and for generating latch signals and comprises a multiplexer controlled by said second input signals and for receiving said latch signals and for generating a selection signal.

Said latches are for example D-FlipFlops each receiving the first input signal for example being the ClocK signal between their D-input and D-input-inverse and each generating a latch signal between their Q-output and Q-output-inverse, with the second input signal for example being the REFerence signal being supplied to the ClocK-input of the first latch and to the ClocK-input-inverse of the second latch and to a control input of said multiplexer. This low-complex-low-cost embodiment does not have any loop, compared to said prior art phase detector, in which the outputs of the FlipFlops are fed back via said NAND to the Reset-inputs of said FlipFlops. For said second embodiment, these Reset-inputs are not used (and/or left open and/or left unconnected) for phase locking purposes.

A third embodiment of the phase detector according to the invention as defined in claim 4 is advantageous in that said phase circuit comprises a converter for converting said input signals into compensated input signals.

Said converter compensates said input signals, for example for process variations, as a result of which the difference establisher will be better able to establish said differences.

A fourth embodiment of the phase detector according to the invention as defined in claim 5 is advantageous in that said converter comprises per input signal a buffer circuit coupled to a replica circuit.

Said buffer circuit coupled to said replica circuit compensates per input signal for temperature variations, with both combinations of buffer circuit plus replica circuit providing compensated input signals having (substantially) equal amplitudes, for improving the establishing of differences.

A fifth embodiment of the phase detector according to the invention as defined in claim 6 is advantageous in that said difference establisher comprises a subtracting circuit for subtracting compensated input signals from each other and generating a result signal and comprises a modulus circuit for generating moduli of said result signal, with said phase detector comprising a multiplexer to be controlled by a selection signal for selecting a modulus.

A first difference signal then for example comprises the positive modulus of a difference between said compensated input signals, and a second difference signal then for example comprises the negative modulus of a difference between said compensated input signals, with said multiplexer selecting one of these generated moduli.

A sixth embodiment of the phase detector according to the invention as defined in claim 7 is advantageous in that said difference establisher comprises a subtracting circuit for subtracting compensated input signals from each other and generating a result signal and comprises a squaring circuit for generating squares of said result signal, with said phase detector comprising a multiplexer to be controlled by a selection signal for selecting a square.

A first difference signal then for example comprises the positive square of a difference between said compensated input signals, and a second difference signal then for example comprises the negative square of a difference between said compensated input signals, with said multiplexer selecting one of these generated squares.

Embodiments of the Phase Locked Loop according to the invention, of the method according to the invention and of the processor program product according to the invention correspond with the embodiments of the phase detector according to the invention.

These and other aspects of the invention will be apparent from and elucidated with reference to the embodiments(s) described hereinafter.

Figures 2A, 2B:
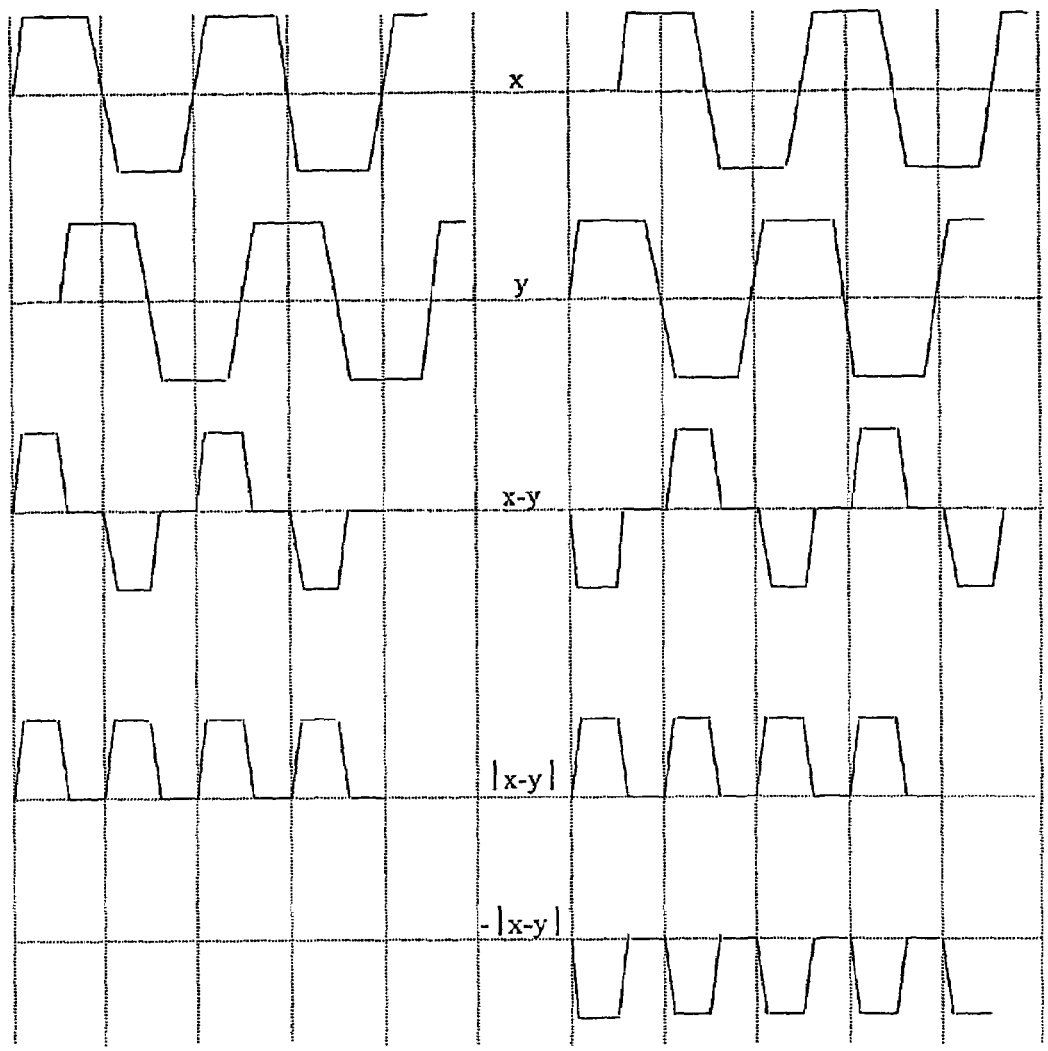

FIG. 1 illustrates in block diagram form a phase detector according to the invention comprising a difference establisher with a modulus circuit and a selector, and FIG. 2 illustrates a timing diagram for said phase detector according to the invention based upon a modulus calculation, with FIG. 2a disclosing the compensated CLK signal or x-signal leading the compensated REF signal or y-signal, and with FIG. 2b disclosing the compensated CLK signal or x-signal lagging the compensated REF signal or y-signal.

The phase detector shown in FIG. 1 comprises a difference establisher 1 comprising a subtracting circuit 11 receiving an x-signal (being a compensated CLocK signal) and a y-signal (being a compensated REFerence signal) and generating an (x-y)-signal being a result signal. Difference establisher 1 comprises a modulus circuit 12 for calculating moduli |x-y| and −|x-y| to be supplied to a multiplexer 13 for generating a phase lock signal.

A converter 3 comprises a buffer circuit 31 for receiving a CLocK signal and coupled to a replica circuit 32 for generating a compensated CLocK signal or x-signal, and comprises a buffer circuit 33 for receiving a REFerence signal and coupled to a replica circuit 34 for generating a compensated REFerence signal or y-signal. Converter 3 compensates said input signals, for example for process variations, as a result of which difference establisher 1 will be better able to establish said differences. Said buffer circuit 31,33 coupled to said replica circuit 32,34 compensates per input signal for temperature variations, with both combinations 31-32 and 33-34 providing compensated input signals having (substantially) equal amplitudes, for improving the establishing of differences. In other words, the replica bias circuit 32, 34 makes the x-signal and y-signal substantially equal to each other and compensated with process errors and temperature variations.

The phase detector shown in FIG. 1 further comprises a selector 2 comprising latches 21 and 22 each in the form of for example a D-FlipFlop and each receiving the CLocK signal between the D-input and D-input-reverse and each being clocked by the REFerence signal (with latch 21 receiving the REF signal at its clock-input and with latch 22 receiving the REF signal at its clock-input-reverse. Both latches 21 and 22 generate latch signals present between their Q-output and Q-output reverse, which latch signals are supplied to a multiplexer 23 controlled by said REF signal. Thereby, the latch signal from latch 21 is supplied straightly, with the latch signal from latch 22 being supplied reversely. The output signal from multiplexer 23 is a selection signal and is supplied to a control input of multiplexer 13.

In view of FIG. 2a, with the compensated CLK signal or x-signal leading the compensated REF signal or y-signal, the phase detector shown in FIG. 1 functions as follows. Selector 2 is a kind of a decision circuit with a bang-bang-operation and acting as a one-bit-quantizer, with both D-FlipFlops 21,22 being sampled/clocked on both edges of the REF signal. Selector 2 decides that the compensated CLK signal or x-signal is leading the compensated REF signal or y-signal, and multiplexer 23 will generate a selection signal destined for multiplexer 13 and controlling multiplexer in such a way that the positive modulus+|x-y| is chosen to be the phase lock signal. As can be derived from FIG. 2a, this obviously is the right choise.

In view of FIG. 2b, with the compensated CLK signal or x-signal lagging the compensated REF signal or y-signal, the phase detector shown in FIG. 1 functions as follows. Selector 2 now decides that the compensated CLK signal or x-signal is lagging the compensated REF signal or y-signal, and multiplexer 23 will generate a selection signal destined for multiplexer 13 and controlling multiplexer in such a way that the negative modulus−|x-y| is chosen to be the phase lock signal. As can be derived from FIG. 2b, this obviously is the right choice.

The invention is based upon an insight, inter alia, that differences between said input signals will give an indication of the phase (difference) to be detected, and is based upon a basic idea, inter alia, that several differences can be established (by subtracting a first one from a second one or vice versa with the first one either leading or lagging the other one), after which the best one (the right one) is to be selected.

The invention solves the problem, inter alia, of providing a phase detector which operates properly under more severe conditions, and is advantageous, inter alia, in that any deadzone of this phase detector has disappeared, as a result of establishing differences and selecting one of them.

Said feedbackless selector 2 does not have any loop (at block level), as a result of which at higher frequencies, due to a loop delay in said selector no longer existing (at block level), the linear range (the range in which the phase detector operates linearly) will not get any smaller. And due to any loop no longer being present in said selector 2 (at block level), for sampled input signals, the output jitter will not increase.

Preferably, the delay in selector 2 (from input signals to selection signal) is smaller than the sum of the delays of converter 3 (from input signals to compensated input signals) and difference establisher 1 (from subtracting circuit 11 via modulus circuit 12 to multiplexer 13), then multiplexer 13 will be ready before the moduli have arrived. Further, both paths in modulus circuit 12 should have substantially equal delays to avoid the introduction of phase errors.

Modulus circuit 12 is for example realized via $|z|=z \cdot \text{sign}(z)$ through a circuit comprising twelve transistors Q1-Q12 and five current sources CS1-CS5. Collectors of Q9,Q10, Q11,Q12 are coupled to a positive voltage source, and bases of Q12 and Q9 are coupled to each other and of Q11 and Q10 are coupled to each other and receive a bias voltage. The emitter of Q12 is coupled to the basis of Q1 and to a first current source CS1 ($I_o(1+z)$), with the collector of Q1 being coupled to the emitter of Q9 and to the basis of Q3 and to the collector of Q4 and to the basis of Q5 and to the basis of Q8, and with the emitter of Q1 being coupled to the emitters of Q3, Q4 and Q2 and to a second current source CS2 (Ibias). The emitter of Q11 is coupled to the basis of Q2 and to a third current source CS3 ($I_o(1-z)$), with the collector of Q2 being coupled to the emitter of Q10 and to the basis of Q4 and to the collector of Q3 and to the basis of Q6 and to the basis of Q7. The emitters of Q5 and Q6 are coupled to each other and to a fourth current source CS4 ($I_o(1-z)$), and the emitters of Q7 and Q8 are coupled to each other and to a fifth current source CS5 ($I_o(1+z)$). The collectors of Q5 and of Q7 are coupled to a first common point for conducting a current $-|z|=z \cdot \text{sign}(z)$ and the collectors of Q6 and Q8 are coupled to a second common point for conducting a current $+|z|=z \cdot \text{sign}(z)$.

Alternatively, instead of a modulus circuit 12, a squaring circuit could be introduced, for generating a first square $+(x-y)^2$ and a second square $-(x-y)^2$. This could for example be realized via $z^2 = z \cdot z$ through a circuit comprising six transistors Q5-Q10 and four current sources CS1,CS3,CS4,CS5. Collectors of Q9,Q10 are coupled to a positive voltage source, and the basis of Q9 and of Q10 receive a bias voltage. The emitter of Q9 is coupled to the bases of Q5 and Q8 and to a first current source CS1 (Io(1+z)). The emitter of Q10 is coupled to the bases of Q6 and Q7 and to a third current source CS3 (Io(1−z)). The emitters of Q5 and Q6 are coupled to each other and to a fourth current source CS4 (Io(1−z)), and the emitters of Q7 and Q8 are coupled to each other and to a fifth current source CS5 (Io(1+z)). The collectors of Q5 and of Q7 are coupled to a first common point for conducting a current−$z^2$ and the collectors of Q6 and Q8 are coupled to a second common point for conducting a current+$z^2$.

Many alternatives belong to the possibilities without departing from the scope of this invention. Subtracting circuit 11, modulus circuit 12 or squaring circuit 12, and multiplexer 13 can be designed in many different ways. For example said circuits 12 can be designed using other transistors and/or other polarities, and instead of using the "double-wire" construction a "single-wire+earth/ground" construction could be used. Latches 21 and 22 could be in the form of other Flip-Flops and/or other circuits.

The phase detector according to the invention can be used advantageously in Phase Locked Loops or PLLs running at 1 GHz or 10 GHz as for example used in PLL based phase demodulators where a modulated phase is converted into a voltage and in zero-IF (intermediate frequency) receivers requiring a phase detector with possible frequency detection capabilities.

The invention claimed is:

1. Phase detector for detecting a phase between a first input signal and a second input signal, comprising;
    a subtracting circuit for subtracting a first signal derived from a first one of the input signals from a second signal derived from a second one of the input signals to form a result signal representing an arithmetic difference between the first and second signals;
    an arithmetic operation circuit responsive to the result signal for forming multiple difference signals; and
    a selector for selecting one of said difference signals to be an output signal.

2. Phase detector according to claim 1, wherein said selector is a feedbackless selector.

3. Phase detector according to claim 2,wherein said selector comprises latches clocked by said second input signal and for receiving said first input signal and for generating latch signals and comprises a multiplexer controlled by said second input signals and for receiving said latch signals and for generating a selection signal.

4. Phase detector according to claim 1, wherein said phase circuit comprises a converter for converting said input signals into compensated input signals.

5. Phase detector according to claim 4, wherein said converter comprises per input signal a buffer circuit coupled to a replica circuit.

6. Phase detector according to claim 4, wherein said a subtracting circuit subtracts compensated input signals from each other to generating the result signal, and the arithmetic operation circuit comprises a modulus circuit for generating moduli of said result signal, with said phase detector comprising a multiplexer to be controlled by a selection signal for selecting a modulus.

7. Phase detector according to claim 4, wherein said subtracting circuit subtracts compensated input signals from each other to generating the result signal, and the arithmetic operation circuit comprises a squaring circuit for generating squares of said result signal, with said phase detector comprising a multiplexer to be controlled by a selection signal for selecting a square.

8. Phase Locked Loop comprising a phase detector for detecting a phase between a first input signal and a second input signal, said phase detector comprises: a subtracting circuit for subtracting a signal derived from one of the input signals from a signal derived from another of the input signals to form a result signal;
    an arithmetic operation circuit responsive to the result signal for forming multiple difference signals; and
    a selector for selecting one of said difference signals to be an output signal.

9. Method for detecting a phase between a first input signal and a second input signal, wherein said method comprises the step of, subtracting a signal derived from one of the input signals from a signal derived from another of the input signals to form a result signal;
    responsive to the result signal, forming multiple difference signals; and
    selecting one of said difference signals to be an output signal.

* * * * *